(12) United States Patent
Pannese et al.

(10) Patent No.: US 11,749,537 B2
(45) Date of Patent: Sep. 5, 2023

(54) SIDE STORAGE PODS, EQUIPMENT FRONT END MODULES, AND METHODS FOR OPERATING EQUIPMENT FRONT END MODULES

(71) Applicant: Applied Materials, Inc., Santa Clara, CA (US)

(72) Inventors: Patrick Pannese, San Jose, CA (US); Murali Narasimhan, San Jose, CA (US); Paul B. Reuter, Austin, TX (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 876 days.

(21) Appl. No.: 16/657,698

(22) Filed: Oct. 18, 2019

(65) Prior Publication Data

US 2020/0135499 A1    Apr. 30, 2020

Related U.S. Application Data (60) Provisional application No. 62/751,508, filed on Oct. 26, 2018.

(51) Int. Cl.
*B01D 46/00* (2022.01)
*B01D 53/04* (2006.01)
(Continued)

(52) U.S. Cl.
CPC .... *H01L 21/67017* (2013.01); *B01D 46/0039* (2013.01); *B01D 53/0446* (2013.01);
(Continued)

(58) Field of Classification Search
CPC ................ B01D 46/442; B01D 46/446; B01D 2258/0216; B01D 2279/51; B08B 17/00; F24F 3/1607; H01L 21/67017
(Continued)

(56) References Cited

U.S. PATENT DOCUMENTS 6,758,876 B2 * 7/2004 Suzuki ............. H01L 21/67393
454/192
6,960,236 B1 * 11/2005 Tamura ................. F24F 3/1423
502/67

(Continued)

FOREIGN PATENT DOCUMENTS

JP        2015146349 A     8/2015
KR       101682473 B1    12/2016
(Continued)

OTHER PUBLICATIONS

PCT International Search Report and Written Opinion for International Application No. PCT/US2019/057276, dated Mar. 25, 2020, 10 pages.

*Primary Examiner* — Minh Chau T Pham
(74) *Attorney, Agent, or Firm* — Lowenstein Sandler LLP (57) ABSTRACT

Electronic device processing assemblies including an EFEM with at least one side storage pod attached thereto. The side storage pod has a side storage pod container. A supply conduit extends between an upper plenum of the EFEM to the side storage pod container. A fan causes purge gas to simultaneously flow into the EFEM chamber and into the side storage pod container. The fan also causes recirculation of the purge gas from the EFEM chamber. Methods of operating EFEMs and EFEMs are also disclosed.

20 Claims, 5 Drawing Sheets

(51) Int. Cl.
  *H01L 21/67* (2006.01)
  *H01L 21/677* (2006.01)
  *H01L 21/673* (2006.01)

(52) U.S. Cl.
  CPC .. *H01L 21/67167* (2013.01); *H01L 21/67389* (2013.01); *H01L 21/67769* (2013.01); *B01D 2253/102* (2013.01); *B01D 2259/4525* (2013.01); *B01D 2279/35* (2013.01)

(58) Field of Classification Search
  USPC ... 55/385.2, 385.6, 338, 340, 467, 482, 318, 55/473, DIG. 34; 95/12, 90, 273; 96/111, 134, 142, 417; 454/187, 238, 454/255
  See application file for complete search history.

(56) References Cited

U.S. PATENT DOCUMENTS

| | | | |
|---|---|---|---|
| 7,199,859 B2 * | 4/2007 | Yamada | H01L 21/67745 355/53 |
| 7,914,613 B2 * | 3/2011 | Matsuoka | H01L 21/67225 96/417 |
| 8,603,217 B2 * | 12/2013 | Sukhman | B01D 53/0446 95/8 |
| 9,272,315 B2 * | 3/2016 | Chou | B01D 46/442 |
| 9,991,139 B2 | 6/2018 | Osterlaken et al. | |
| 2001/0042439 A1 * | 11/2001 | Roberson, Jr. | H01L 21/67017 96/111 |
| 2002/0194995 A1 * | 12/2002 | Shiramizu | B01D 46/0039 95/273 |
| 2004/0000129 A1 * | 1/2004 | Ishihara | H01L 21/67017 55/385.2 |
| 2004/0187452 A1 * | 9/2004 | Edo | B01D 53/265 55/385.2 |
| 2005/0160705 A1 * | 7/2005 | Bernard | H01L 21/67017 206/710 |
| 2007/0144118 A1 * | 6/2007 | Alvarez | H01L 21/67389 55/385.1 |
| 2015/0228518 A1 | 8/2015 | Hyon | |

FOREIGN PATENT DOCUMENTS

| | | |
|---|---|---|
| KR | 101758214 B1 | 7/2017 |
| KR | 20180045316 A | 5/2018 |

* cited by examiner

SIDE STORAGE PODS, EQUIPMENT FRONT END MODULES, AND METHODS FOR OPERATING EQUIPMENT FRONT END MODULES

RELATED APPLICATIONS

This application claims the benefit under 35 U.S.C. § 119(e) of U.S. Provisional Patent Application No. 62/751,508, filed Oct. 26, 2018, which is incorporated herein, in its entirety, by this reference.

TECHNICAL FIELD

The present disclosure relates to electronic device manufacturing, and more specifically to equipment front end modules (EFEMs), side storage pods (SSPs), and methods for operating EFEMs.

BACKGROUND

Electronic device manufacturing assemblies may include multiple process chambers arranged around a mainframe housing defining a transfer chamber and one or more load lock chambers configured to pass substrates into and out of the transfer chamber.

Processing of substrates (e.g., semi-conductor components such as chip precursors, silicon-containing wafers, masks, masked wafers, or glass-containing sheets) in electronic device manufacturing may be carried out in multiple tools, where the substrates travel between the tools in substrate carriers such as front end unified pods (FOUPs). Exposure of the substrates to certain processing components (e.g., compounds and/or gases) during processing may degrade the substrates if not properly removed after processing. For example, acids can be formed on the substrates by exposure to the components, which may degrade components fabricated onto the substrates.

Accordingly, improved electronic device processing assemblies, apparatus, and methods for controlling the environmental conditions of substrates during processing are desired.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing may involve exposing substrates to different chemicals during a plurality of processes. In between different processes being applied to the substrates, the substrates may undergo outgassing. Some processes applied to the substrate may cause the substrate to outgas corrosive chemicals, such as fluorine, bromine, and/or chlorine. If these gasses are not substantially completely removed from the substrates and the environment they are in, the gasses may degrade the substrates.

According to one or more embodiments of the disclosure, electronic device processing assemblies, EFEMs with SSPs, and methods adapted to improve substrate processing are provided. The assemblies, apparatus, and methods described herein may provide efficiency and/or processing improvements in the processing of substrates by controlling environmental exposure of the substrates, and, in particular, conditions within one or more SSPs coupled to an equipment front end module. One or more side storage containers may be configured to be receivable as part of the SSP and may include substrate holders (e.g., shelves) that receive and support substrates therein, such as during idle periods before and/or after processes are applied to the substrates.

In one or more embodiments, a purge gas may flow from a side storage container where it flows past substrates located therein into an EFEM chamber. The gas may be recirculated within the EFEM and some may be exhausted from the base of the EFEM. In some embodiments, the gas can be passed through a chemical filter located in an upper portion of the EFEM. Some of the filtered gas may then be recirculated back into the EFEM chamber. In some embodiments, the recirculation path of the gas may pass through an access door to the EFEM, which may minimize the space occupied by the recirculation path. The gas recirculated into the EFEM chamber includes certain chemical components filtered and minimized by the chemical filter. In addition, the substrates are exposed to the purge gas within the EFEM, which may have certain environmental conditions, such as being relatively dry and/or having relatively low $O_2$ levels.

Further details of example embodiments of SSPs, EFEMs including a SSP, and methods of operating EFEMs are described with reference to FIGS. 1-5 herein.

Figure 1:
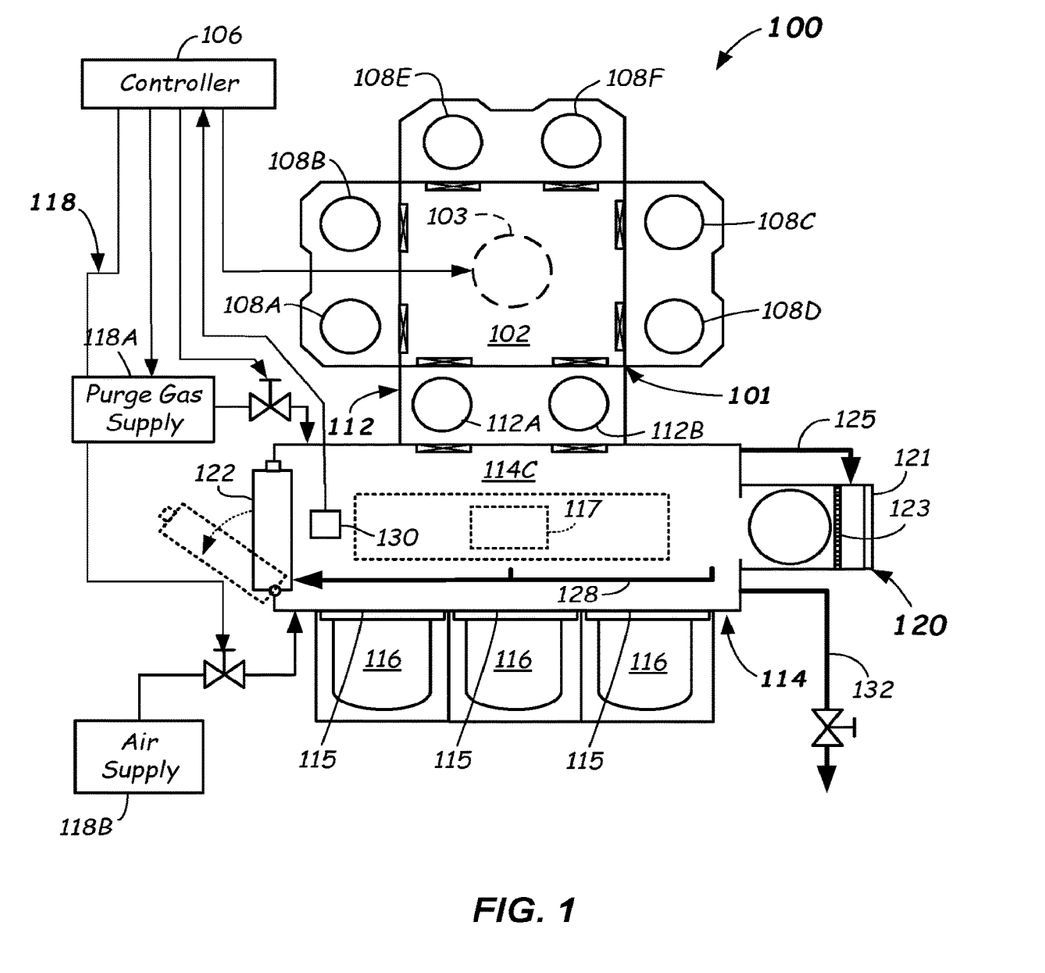
FIG. 1 illustrates a schematic top view of an electronic device processing assembly including side storage pod (SSP) according to one or more embodiments of the disclosure.

FIG. 1 illustrates a schematic diagram of an example embodiment of an electronic device processing system 100 according to one or more embodiments of the present disclosure. The electronic device processing system 100 may include a mainframe housing 101 having housing walls defining a transfer chamber 102. A transfer robot 103 (shown as a dotted circle) may be at least partially housed within the transfer chamber 102. The transfer robot 103 may be configured to place and extract substrates to and from destinations via operation of arms (not shown) of the transfer robot 103. Substrates as used herein may mean articles used to make electronic devices or circuit components, such as semiconductor wafers, silicon-containing wafers, patterned or un-patterned wafers, glass plates, masks, and the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103.

Suitable feedback mechanisms may be provided for one or more of the components by various sensors, such as position encoders, or the like.

The transfer chamber 102 in the depicted embodiment may be square or slightly rectangular in shape, although other shapes are possible (e.g., hexagonal, etc.) and may include a plurality of facets on the walls of the transfer chamber 102. The transfer robot 103 may be adept at transferring and/or retracting substrates, such as at a same time into the chamber sets (as shown). The facets may be planar and entryways into the chamber sets that may lie along the respective facets. However, other suitable shapes of the mainframe housing 101 and numbers of facets and processing chambers are possible.

The destinations for the transfer robot 103 may be a first process chamber set 108A, 108B, coupled to a facet of the transfer chamber 102 and which may be configured and operable to carry out a process on the substrates delivered thereto. The process may be any suitable process such as plasma vapor deposition (PVD) or chemical vapor deposition (CVD), etch, annealing, pre-clean, metal or metal oxide removal, or the like. Other processes may be carried out on substrates therein.

The destinations for the transfer robot 103 may also be a second process chamber set 108C, 108D that may be opposed from the first process chamber set 108A, 108B. The second process chamber set 108C, 108D may be coupled to a second facet of the transfer chamber 102 and may be configured to carry out any suitable process on the substrates, such as any of the processes mentioned above. Likewise, the destinations for the transfer robot 103 may also be a third process chamber set 108E, 108F that may be opposed from a load lock apparatus 112 coupled to a third facet of the transfer chamber. The third process chamber set 108E, 108F may be configured to carry out any suitable process on the substrates, such as any of the processes mentioned above.

Substrates may be received into the transfer chamber 102 from an EFEM 114, and also exit the transfer chamber 102, to the EFEM 114, through the load lock apparatus 112 that is coupled to a surface (e.g., a rear wall) of the EFEM 114. The load lock apparatus 112 may include one or more load lock chambers (e.g., load lock chambers 112A, 112B, for example). Load lock chambers 112A, 112B included in the load lock apparatus 112 may be single wafer load lock (SWLL) chambers, multi-wafer chambers, or combinations thereof.

The EFEM 114 may be an enclosure having walls (such as front wall, rear wall, side walls, a top wall, and a bottom wall, for example) forming an EFEM chamber 114C. One or more load ports 115 may be provided on one of the walls (e.g., a front wall) of the EFEM 114 and may be configured to receive and dock one or more substrate carriers 116 (e.g., FOUPs) thereat. Three substrate carriers 116 are shown, but more or less numbers of substrate carriers 116 may be docked with the load ports 115 at the EFEM 114.

EFEM 114 may include a suitable load/unload robot 117 (hereinafter "EFEM robot"—shown dotted) of conventional construction within the EFEM chamber 114C thereof. The EFEM robot 117 may be configured and operational, once a door of a substrate carrier 116 is opened, to extract substrates from the substrate carrier 116 and feed the substrates through the EFEM chamber 114C and into the one or more load lock chambers 112A, 112B of the load lock apparatus 112.

The EFEM robot 117 may be also be configured and operational, once the door of a substrate carrier 116 is opened, to extract substrates from the substrate carrier 116 and feed the substrates into a SSP 120 while they sit idle awaiting processing. The SSP 120 may be coupled to a side wall of the EFEM 114. The EFEM robot 117 may further be configured to extract substrates from and load substrates into the side storage pod 120 prior to and after processing in one or more of the process chambers 108A-108F. In some embodiments, the EFEM robot 117 is a high-Z robot configured to access substrates stacked greater than 26 high, or even fifty-two high or higher, in the SSP 120. The SSP 120 can include maintenance doors 121 to allow operators to access the inside of the SSP 120 when necessary (e.g., during an error condition or to maintain/clean).

In the depicted embodiment, the EFEM chamber 114C may be provided with environmental controls providing an environmentally-controlled atmosphere therein. In particular, an environmental control apparatus 118 may be coupled to the EFEM chamber 114C and may be operational to monitor and/or control environmental conditions within the EFEM chamber 114C. In some embodiments, and at certain times, the EFEM chamber 114C may receive a purge gas (e.g., an inert and/or non-reactive gas) therein, such as argon (Ar), nitrogen ($N_2$), or helium (He) from a purge gas supply 118A. In other embodiments, or at other times, air (e.g., dry filtered air) may be provided from an air supply 118B. The environmental conditions within the EFEM chamber 114C may be present in the interiors of side storage containers 124 located within and as part of the SSP 120. In some embodiments, the SSP 120 may have substrate holders located therein to receive substrates without the use of side storage containers. Although not shown in FIG. 1, in some embodiments, the purge gas supply 118A and/or the air supply 118B may be coupled to the SSP 120 to optionally supply gas/air directly to the SSP 120 as signified by arrows 208.

In more detail, the environmental control apparatus 118 may control at least one or more of: 1) relative humidity (RH), 2) temperature (T), 3) an amount of $O_2$, and/or 4) an amount of purge gas, within the EFEM chamber 114C. Other environmental conditions of the EFEM chamber 114C may be monitored and/or controlled, such as gas flow rate into the EFEM chamber 114C, or pressure in the EFEM chamber 114C, or both.

In some embodiments, the environmental control apparatus 118 includes a controller 106. Controller 106 may include a suitable processor (e.g., a microprocessor), memory, and electronic components for receiving inputs from one or more sensors 130 and controlling one or more valves to control the environmental conditions within the EFEM chamber 114C. Environmental control apparatus 118 may, in one or more embodiments, monitor relative humidity (RH) by sensing RH in the EFEM chamber 114C with a sensor 130. Any suitable type of sensor that measures relative humidity may be used, such as a capacitive-type sensor. The RH may be lowered by flowing a suitable amount of the purge gas from the purge gas supply 118A of the environmental control apparatus 118 into the EFEM chamber 114C. As described herein, the inert and/or non-reactive gas from the purge gas supply 118A may be argon, $N_2$, helium, another non-reactive gas, or mixtures thereof. In some embodiments, compressed bulk inert gases having low $H_2O$ levels (e.g., purity$\geq$99.9995%, $H_2O \leq 5$ ppm) may be used as the purge gas supply 118A in the environmental control apparatus 118, for example. Other $H_2O$ levels may be used.

In another aspect, the sensor 130 may measure a plurality of environmental conditions. For example, in some embodiments, the sensor 130 may measure the relative humidity RH value as discussed above. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device processing assembly 100 or particular substrates exposed to the environment of the EFEM 114. The sensor 130 may also measure a level of oxygen ($O_2$) within the EFEM chamber 114C. In some embodiments, a control signal from the controller 106 to a valve of the environmental control apparatus 118 can initiate a flow of a suitable amount of an purge gas from the purge gas supply 118A into the EFEM chamber 114C may take place to control the level of oxygen ($O_2$) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device processing system 100 or particular substrates exposed to the environment of the EFEM 114. In some embodiments, the sensor 130 may sense the level of oxygen in the EFEM chamber 114C to ensure it is above a safe threshold level to allow entry into the EFEM chamber 114C.

The sensor 130 may also measure the absolute or relative pressure within the EFEM 114. In some embodiments, the controller 106 may control the amount of flow of purge gas from the purge gas supply 118A into the EFEM chamber 114C or elsewhere into the EFEM 114 to control the pressure in the EFEM chamber 114C.

In some embodiments, the environmental control apparatus 118 of the electronic device processing assembly 100 may include an air supply 118B coupled to the EFEM chamber 114C. The air supply 118B may be coupled by suitable conduits and one or more valves to the EFEM chamber 114C or elsewhere in the EFEM 114.

In the depicted embodiments herein, the controller 106 may be an overall system controller including a processor (e.g., a microprocessor), memory, and peripheral components adapted to receive control inputs (e.g., relative humidity and/or oxygen) from the sensor 130 and execute a closed loop or other suitable control scheme. In some embodiments, the control scheme may change a flow rate of a gas being introduced into the EFEM 114 to achieve a predetermined environmental condition in the EFEM chamber 114C. In some other embodiments, the control scheme may determine when to transfer substrates into the EFEM 114.

As will be described in detail below, in operation, purge gas is circulated from an upper plenum 204 of the EFEM 114 into both the EFEM chamber 114C and via one or more supply conduits 125 into the SSP 120. Flow to the substrates and into the EFEM chamber 114C is through a supply baffle 123. Gas exits the side storage pod 120 into the EFEM chamber 114C. A portion is recirculated via recirculation duct 128 and another portion is exhausted via exhaust conduit 132.

Figure 2:
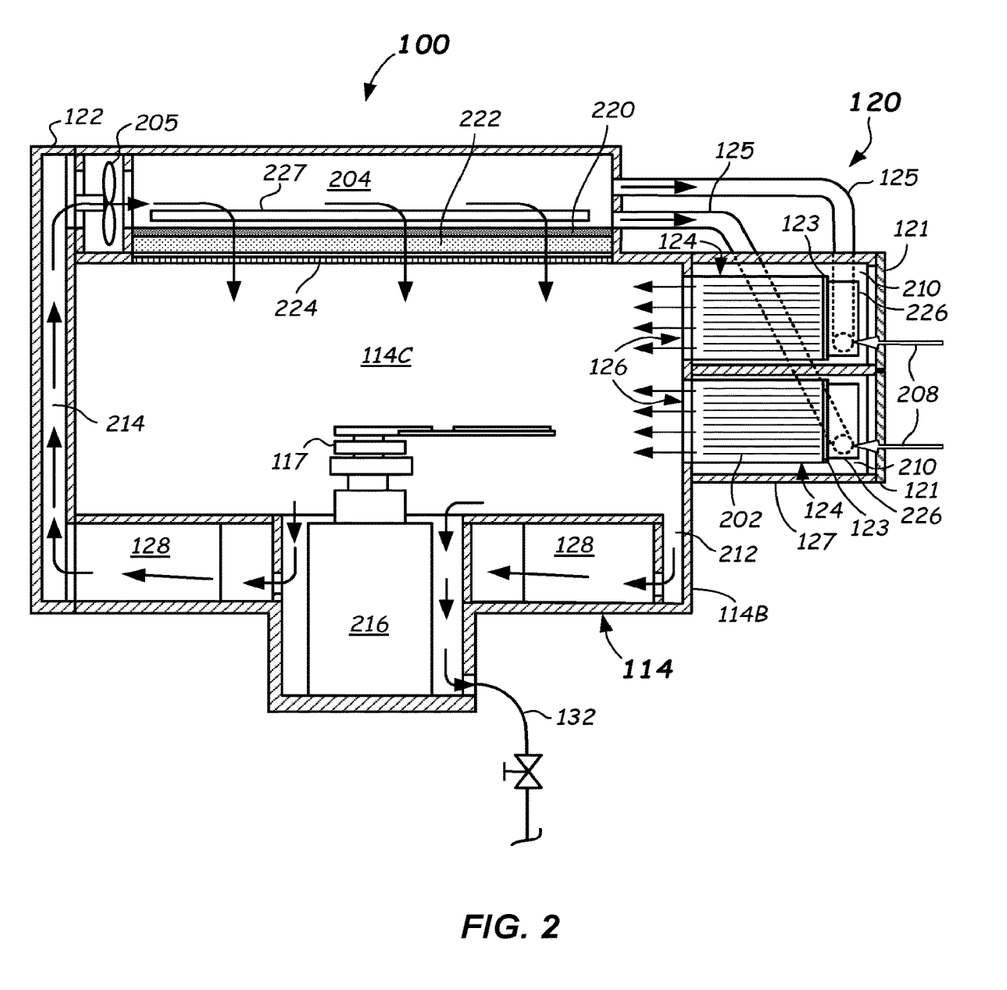
FIG. 2 illustrates a side cross-sectioned view of an EFEM including a SSP coupled to the EFEM body according to one or more embodiments of the disclosure.
Figure 3:
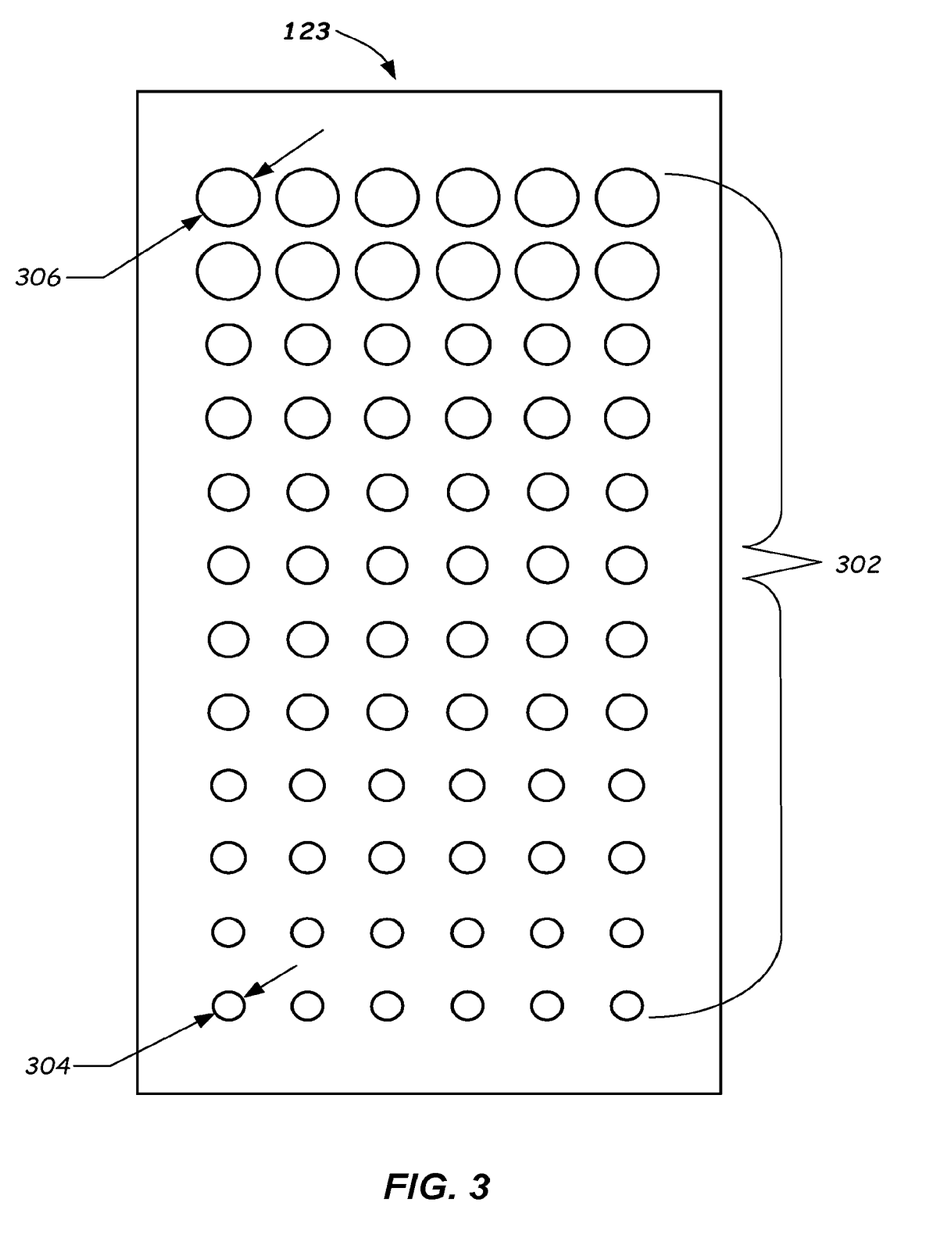
FIG. 3 illustrates a front plan view of a supply baffle of a SSP according to one or more embodiments of the disclosure.
Figure 4:
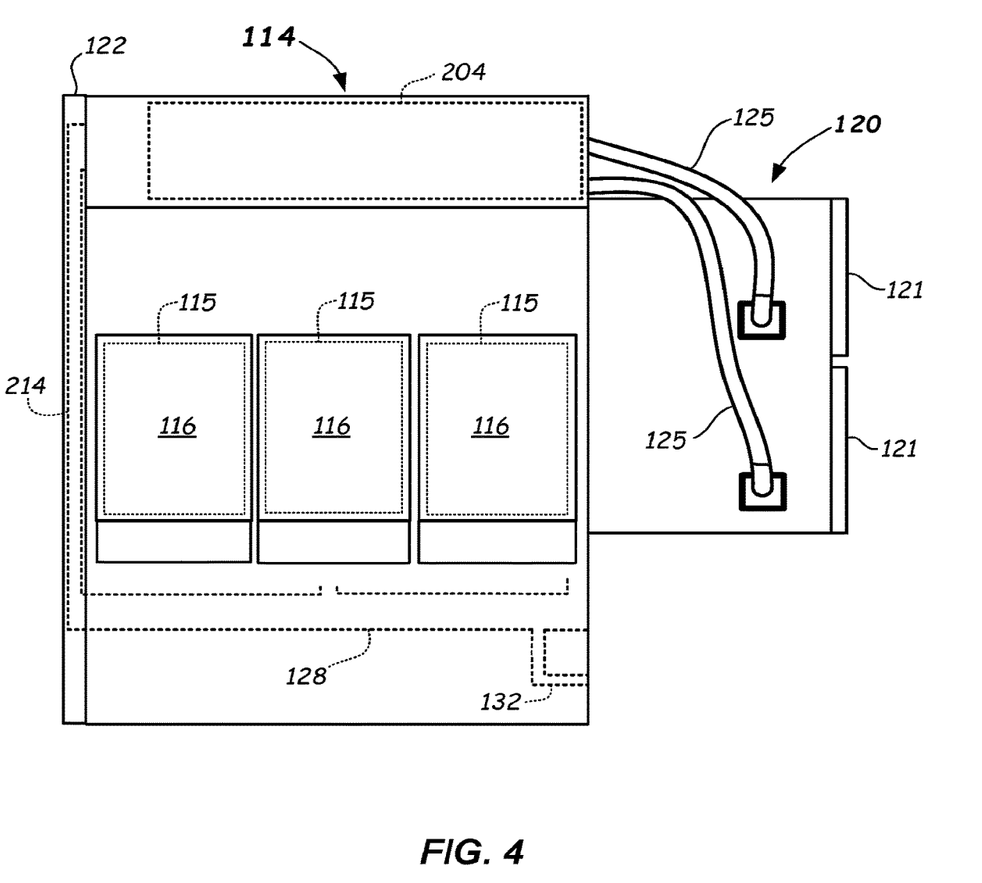
FIG. 4 illustrates a front plan view of an EFEM including a SSP according to one or more embodiments of the disclosure.

Turning now to FIGS. 2 through 4, details of the SSP 120 and how it couples to the wall of the EFEM body are described. FIG. 2 is a side, cross-sectional, elevation view of the EFEM 114 including the SSP 120 coupled to the EFEM body 114B. FIG. 3 depicts details of a gas supply baffle 123. FIG. 4 is a front elevation view of the EFEM 114 including the SSP 120 coupled to the EFEM body 114B of the EFEM 114. In some embodiments, the SSP 120 may be removably attached to the EFEM 114. The SSP 120 may be used to store substrates 202 under specific environmental conditions. For example, the side storage pod 120 may store the substrates 202 in the same environmental conditions as are being maintained in the EFEM chamber 114C, except that they may be exposed to a relatively higher purge gas flow rate. The SSP 120 may be fluidly coupled to (i.e., in fluid communication with) the EFEM chamber 114C and may receive recirculated gas (e.g., inert gas) from an upper plenum 204 within the EFEM 114. Accordingly, substrates 202 stored in the SSP 120 are exposed to the same environmental conditions as the EFEM chamber 114C, except for flow rate. The SSP 120 may include supply conduits 125 that carry recirculated gas from upper plenum 204 of the EFEM 114 to the SSP 120, which further enables substrates 202 stored in the SSP 120 to be constantly exposed to the desirable environmental conditions.

Recirculated purge gas may be pushed from the upper plenum 204 into the supply conduits 125 and the EFEM chamber 114C by a fan 205 located adjacent the upper plenum 204. In some embodiments, the gas flow through the SSP 120 is 150-200 cfm (4.25-5.67 cmm), or even 150-175 cfm (4.25-5.0 cmm). In some embodiments, some new gas (e.g., inert or non-reactive gas) may additionally or alternatively be supplied to the supply conduits 125 via gas supplies 208. This flow may supplement the flow rate through the SSP 120 to ensure that a minimum flow rate there through is achieved. Optionally, a flow-control mechanism such as a flow control valve (not shown), may be provided in the supply conduits 125 to control flow rate therein. Some small amount of the gas from the EFEM chamber 114C may be exhausted from an exhaust 132 to external to the EFEM 114. Thus, over time, the volume of purge gas in the EFEM chamber 114C may be slowly exchanged.

The SSP 120 can include and be adapted to receive one or more side storage containers 124. In some embodiments, the SSP 120 may receive one or more vertically-aligned side storage containers 124 within side storage chambers 210 of the SSP 120. The side storage containers 124 may include openings 126 that face the EFEM chamber 114C and that can be disposed adjacent one entry 212 into a recirculation duct 128. The recirculation duct 128 includes a portion 214 in the door 122 that leads to fan 205 and the upper plenum 204. Recirculation duct 128 can include additional passages as shown that allow the gas to flow around the base 216 of the EFEM robot 117, for example.

Side storage containers 124 may be sealed within the SSP housing 127 so that exhaust gas from within the interior of the side storage containers 124 may not enter the interior of the chambers 210 of the SSP 120. Thus, as indicated by the various gas flow arrows, a portion of the purge gas may exit the EFEM chamber 114C through the exhaust 132 to an exterior of the EFEM 114, while another portion of the purge gas may be recirculated back through the recirculation duct 128 and portion 214 through the access door 122.

A filter 220 may be in the gas flow path generated by the fan 205. For example, the filter 220 may be located proximate the upper plenum 204 so that the purge gas pushed by the fan 205 passes through the filter 220. In some embodiments, the filter 220 may be a chemical filter that filters one or more gasses that are outgassed by a substrate 202 in the SSP 120 after application of a fabrication process. In some embodiments, the chemical filter 220 is adapted to filter chlorine, bromine, and/or fluorine. In some embodiments, the filter 220 may filter base gasses, such as ammonia ($NH_3$) to less than or equal to 5.0 ppb. In some embodiments, the filter 220 may filter acidic gasses, such as fluorine (F), chlorine (Cl), bromine (Br), acetate (OAc), nitrogen dioxide ($NO_2$), nitrate ($NO_3$), phosphate ($PO_4$), hydrogen fluoride (HF), and hydrochloric acid (HCl) to equal to or less than 1.0 ppb. In some embodiments, the filter 220 may be an activated carbon filter.

In some embodiments, a particulate filter 222 may be provided to filter small particulates from entering the EFEM chamber 114C. The filter may be fine enough to filter (e.g., ≥99.99%) of particulates that could be harmful to the electronic components being fabricated on the substrates. Further, in some embodiments, a homogenization plate 224, including small perforations throughout, may be used to provide uniform flow there through and into the EFEM chamber 114C. The homogenization plate 224 may include a plurality of openings and/or a porous material adapted to uniformly distribute the gas flow from the upper plenum 204 evenly across the EFEM chamber 114C.

In some embodiments, the gas supplied to the SSPs 120 through conduits 125 may be located downstream of the filters 220, 222, such as coupled to a space between the particulate filter 222 and the homogenization plate 224.

In some embodiments, a heater 227 may also be located in the gas flow generated by the fan 205. The heater 227 may heat the purge gas to a predetermined temperature as the exhaust gas is recirculated into the EFEM chamber 114C and to the SSP 120. In some embodiments, the heat generated by the heater 227 may be used as a reactant and/or to change the relative humidity in the EFEM chamber 114C and/or the side storage pod 120. In some embodiments, the heater 227 may heat the gas in the EFEM 114 to increase outgassing from substrates 202 located in the side storage pod 120. The heater 227 may increase the temperature of the gas in the EFEM chamber 114C and SSP 120 to 5° C. or more, 10° C. or more, or even from 5° C. to 25° C., above ambient temperature outside of the EFEM 114.

In some embodiments, the filters 220, 222, the heater 227, and the homogenization plate 224 can be combined in one or more different combinations. In some embodiments, the filters 220, 222, the heater 227, and the homogenization plate 224 can be disposed in a different order than shown in FIG. 2. For example, the homogenization plate 224 and the filter 220, 222 positions can be exchanged; the heater 227 and the filter 220 or 222 can be exchanged. Any practicable arrangement and combination of the filter 220, the heater 227, and/or the homogenization plate 224 may be used.

In some embodiments, the supply conduits 125 to the SSP 120 can include a filter (not shown) and/or a heater (not shown). The supply conduits 125 enable gas flow into the SSP 120 via container plenums 226. Disposed between the container plenums 226 and the remainder of the side storage containers 124 are supply baffles 123 positioned and sized with an appropriate arrangement of openings to uniformly distribute substantially laminar gas flow evenly over the substrates 202 within the side storage containers 124.

An example embodiment of a supply baffle 123 is shown in FIG. 3. In the illustrated example embodiment of a SSP 120, the supply conduits 125 flow gas into the lower portion of the container plenums 226. Thus, the supply baffles 123, as shown in FIG. 3, include an array of openings 302 where a size dimension 304 of openings at the lower end of the supply baffles 123 is smaller than a size dimension 306 of openings at the upper end of the supply baffles 123. The size of the openings 302 may gradually increase from the lower end to the upper end of the supply baffles 123. The sizes of the openings are selected to compensate for the supply conduits 125 being coupled to the lower portion of the container plenums 226 by causing an even amount of gas to flow into the side storage containers 124 along the entire height of the side storage containers 124. In other words, the smaller openings located at the lower portion of the container plenums 226 restrict gas flow more than the larger openings at the top portion. In some embodiments, the openings 302 may range in size from approximately 2 mm to 20 mm, for example. The smaller openings 304 with the smaller diameters may be located proximate to the exhaust port to balance the gas flow. The larger openings 306 may be between 15 mm and 17 mm in some embodiments. The array of openings 302 shown includes round openings 302 but any practicable shape openings may be used.

In some embodiments where the supply conduits are coupled to the container plenums at a different location (e.g., in the middle), the array of openings can be modified to compensate for the different location (e.g., smaller openings can be located in the middle with larger openings at the top and bottom).

By extending the return duct portion 214 through the access door 122, the space occupied by the return duct 128 is kept minimal. As indicated above, the return duct portion 214 in the access door 122 may couple to the upper plenum 202 located at the top of the EFEM 114. The fan 205 may assist drawing the purge gas from the return duct 128 and return duct portion 214 into the upper plenum 204. The upper plenum 204 may include or be coupled to opening(s) that cause a laminar gas flow through the EFEM chamber 114C and SSP 120. Chemical and/or particulate filters may be located in the upper plenum 204.

Figure 5:
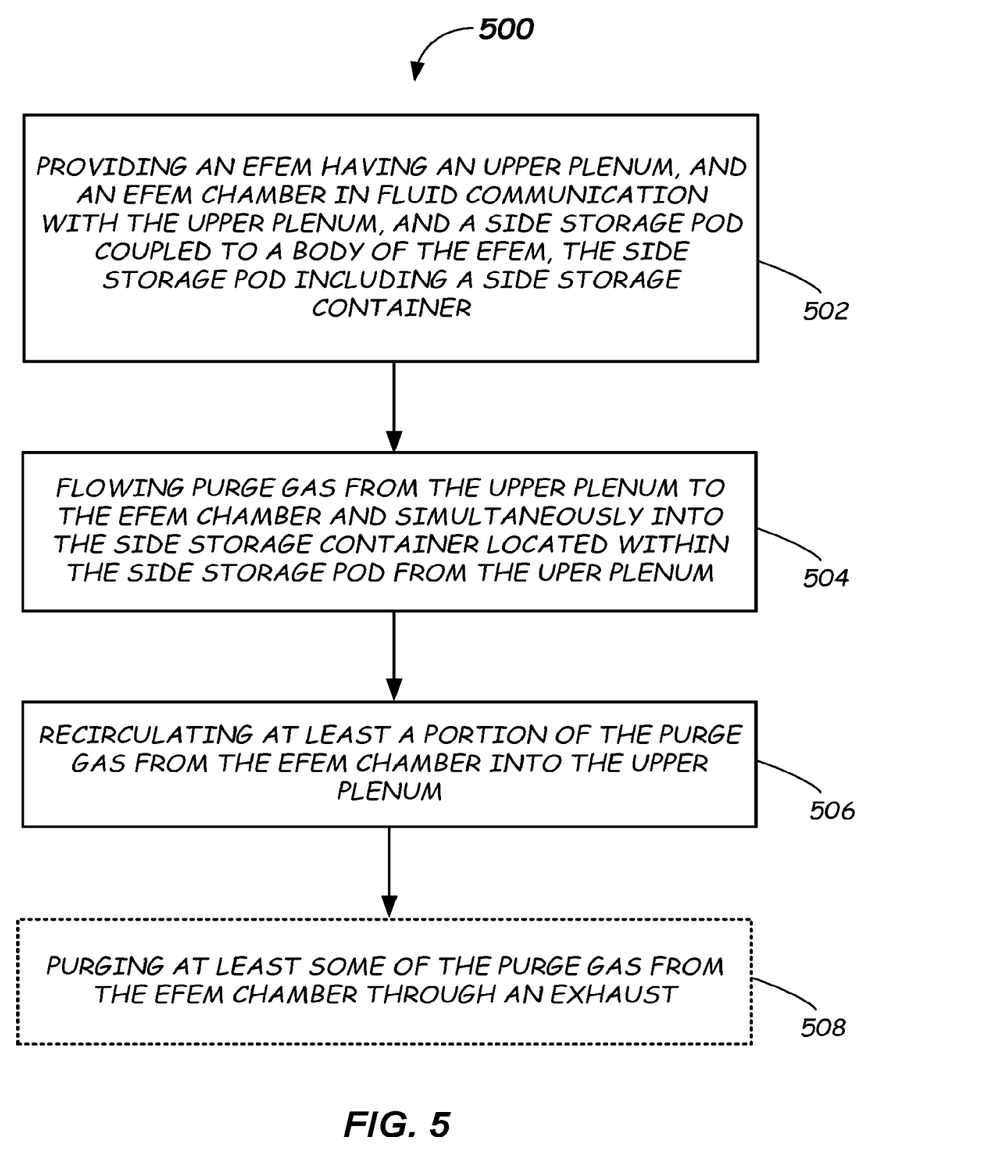
FIG. 5 illustrates a flowchart depicting an example method of operating an EFEM according to one or more embodiments of the disclosure.

Turning now to FIG. 5, an example method 500 of operating an EFEM according to some embodiments is depicted as a flow chart. The method 500 includes providing an EFEM having an upper plenum 204, an EFEM chamber 114C in fluid communication with the upper plenum 204, and a side storage pod 120 including a side storage container 124 (block 502). Purge gas is flowed from the upper plenum 204 into the EFEM chamber 114C and simultaneously into the side storage container 124 located within the SSP 120 from the upper plenum 204 (Block 504). Gas is also exhausted from the side storage container 124 into the EFEM chamber 114C. Meanwhile, at least a portion of the purge gas from the EFEM chamber 114C is recirculated back into the upper plenum 204 (block 506). In some embodiments, at least some of the purge gas from the EFEM chamber 114C is purged from the EFEM chamber 114C through an exhaust 132 (block 508).

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. A side storage pod, comprising:
   a first chamber;
   a first side storage container located in the first chamber, the first side storage container configured to receive one or more substrates from an equipment front end module, the first side storage container including an opening configured to be adjacent to a first opening of the equipment front end module;
   a container plenum in fluid communication with the first side storage container; and
   a first supply conduit coupled to the container plenum and configured to deliver a gas flow from an upper plenum into the container plenum.

2. The side storage pod of claim 1, further comprising a first supply baffle disposed between the container plenum and the first side storage container.

3. The side storage pod of claim 2, wherein the first supply baffle includes a plurality of openings configured to distribute a purge gas flow delivered by the first supply conduit substantially uniformly throughout the first side storage container.

4. The side storage pod of claim 1, wherein the first supply conduit is further couplable to an external purge gas supply.

5. The side storage pod of claim 1, further comprising
a second chamber;
a second side storage container located in the second chamber, the second side storage container configured to receive one or more substrates from the equipment front end module, the second side storage container including an opening configured to be adjacent to a second opening of the equipment front end module;
a second container plenum in fluid communication with the second side storage container; and
a second supply conduit coupled to the second container plenum and configured to deliver a purge gas flow from an upper plenum into the second container plenum.

6. The side storage pod of claim 5, further including a second supply baffle disposed between the second container plenum and the second side storage container wherein the second supply baffle includes a plurality of openings configured to distribute the purge gas flow delivered by the second supply conduit substantially uniformly though the second side storage container.

7. The side storage pod of claim 5, wherein the second supply conduit is further couplable to an external purge gas supply.

8. An electronic device processing assembly, comprising:
an equipment front end module including an equipment front end module chamber having one or more interface openings and an upper plenum in fluid communication with the equipment front end module chamber;
one or more side storage pods attached to a body of the equipment front end module, the one or more side storage pods each comprising:
a first chamber;
a first side storage container located in the first chamber, the first side storage container configured to receive one or more substrates from the equipment front end module chamber, the first side storage container including a first opening located adjacent to a first opening of the equipment front end module chamber;
a first container plenum in fluid communication with the first side storage container; and
a first supply conduit coupled between the upper plenum and the first container plenum and configured to deliver a purge gas flow from the upper plenum into the first container plenum.

9. The electronic device processing assembly of claim 8, further comprising a heater in the upper plenum, the heater configured to heat purge gas in the upper plenum.

10. The electronic device processing assembly of claim 8, further comprising a fan, the fan configured to recirculate purge gas into the upper plenum from the equipment front end module chamber and the first side storage container.

11. The electronic device processing assembly of claim 8, further including a first supply baffle disposed between the first container plenum and the first side storage container.

12. The electronic device processing assembly of claim 11, wherein the first supply baffle includes a plurality of openings configured to distribute the purge gas flow delivered by the first supply conduit substantially uniformly throughout the first side storage container.

13. The electronic device processing assembly of claim 8, wherein the first supply conduit is further couplable to an external purge gas supply.

14. The electronic device processing assembly of claim 8, wherein the side storage pod further comprises:
a second chamber;
a second side storage container located in the second chamber, the second side storage container configured to receive one or more substrates from the equipment front end module chamber, the second side storage container including an opening configured to be adjacent to a second opening of the equipment front end module chamber;
a second container plenum in fluid communication with the second side storage container; and
a second supply conduit coupled between the upper plenum and the second container plenum and configured to deliver a purge gas flow from the upper plenum into the second container plenum.

15. A method of operating an equipment front end module, comprising:
providing an equipment front end module having an upper plenum and an equipment front end module chamber in fluid communication with the upper plenum, and a side storage pod including a side storage container;
flowing purge gas from the upper plenum into the equipment front end module chamber and simultaneously into the side storage container located within the side storage pod from the upper plenum;
exhausting the purge gas from the side storage container into the equipment front end module chamber; and
recirculating at least a portion of the purge gas from the equipment front end module chamber into the upper plenum.

16. The method of claim 15 further comprising purging at least some of the purge gas from the equipment front end module chamber through an exhaust.

17. The method of claim 15, further comprising filtering the purge gas exiting from the upper plenum to the equipment front end module chamber.

18. The method of claim 15 further including heating the purge gas disposed in the equipment front end module.

19. The method of claim 15 further comprising flowing the purge gas through a homogenization plate disposed between the upper plenum and the equipment front end module chamber.

20. The method of claim 15 wherein flowing the purge gas from the upper plenum into the side storage container further includes evenly distributing the purge gas into the side storage container by flowing the purge gas through a baffle plate disposed between a container plenum and the side storage container.

* * * * *